(12) United States Patent
Chiu et al.

(10) Patent No.: US 9,000,445 B2
(45) Date of Patent: Apr. 7, 2015

(54) LIGHT EMITTING DIODE WITH WAVE-SHAPED BRAGG REFLECTIVE LAYER AND METHOD FOR MANUFACTURING SAME

(71) Applicant: Advanced Optoelectronic Technology, Inc., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 14/083,361

(22) Filed: Nov. 18, 2013

(65) Prior Publication Data

US 2014/0291689 A1 Oct. 2, 2014

(30) Foreign Application Priority Data

Mar. 27, 2013 (CN) .......................... 2013 1 01015391

(51) Int. Cl.
*H01L 33/46* (2010.01)
*H01L 33/32* (2010.01)
*H01L 33/00* (2010.01)
*H01L 33/10* (2010.01)

(52) U.S. Cl.
CPC .............. *H01L 33/32* (2013.01); *H01L 33/007* (2013.01); *H01L 33/10* (2013.01)

(58) Field of Classification Search
None
See application file for complete search history.

(56) References Cited

U.S. PATENT DOCUMENTS

| | | | |
|---|---|---|---|
| 2011/0143466 A1* | 6/2011 | Chen et al. ................. | 438/29 |
| 2013/0032825 A1* | 2/2013 | Wasserbauer .................. | 257/88 |
| 2014/0077234 A1* | 3/2014 | Freund ......................... | 257/88 |
| 2014/0131727 A1* | 5/2014 | Chiu et al. .................... | 257/76 |

* cited by examiner

*Primary Examiner* — Minh-Loan Tran
*Assistant Examiner* — Fazli Erdem
(74) *Attorney, Agent, or Firm* — Novak Druce Connolly Bove + Quigg LLP

(57) ABSTRACT

An exemplary light emitting diode includes a substrate and a first undoped GaN layer formed on the substrate. The first undoped GaN layer has ion implanted areas on an upper surface thereof. A plurality of second undoped GaN layers is formed on the first undoped GaN layer. Each of the second undoped GaN layers is island shaped and partly covers at least one corresponding ion implanted area. A Bragg reflective layer is formed on the second undoped GaN layer and on portions of upper surfaces of the ion implanted areas not covered by the second undoped GaN layers. An n-type GaN layer, an active layer and a p-type GaN layer are formed on an upper surface of the Bragg reflective layer in that sequence. A method for manufacturing the light emitting diode is also provided.

20 Claims, 8 Drawing Sheets

LIGHT EMITTING DIODE WITH WAVE-SHAPED BRAGG REFLECTIVE LAYER AND METHOD FOR MANUFACTURING SAME

BACKGROUND

1. Technical Field

The disclosure generally relates to a light emitting diode with a wave-shaped Bragg reflective layer, and a method for manufacturing the light emitting diode.

2. Description of Related Art

In recent years, due to their excellent quality of output light and high luminous efficiency, light emitting diodes (LEDs) have increasingly been used as substitutes for incandescent bulbs, compact fluorescent lamps and fluorescent tubes as light sources of illumination devices.

A light emitting diode chip of an LED includes a substrate, and a buffer layer, an n-type semiconductor, an active layer and a p-type semiconductor formed on the substrate in that sequence. However, light transmitting from the active layer to the substrate is easily absorbed by the buffer layer and the substrate, thereby decreasing the light emitting efficiency of the light emitting diode chip. In order to prevent light from being absorbed by the substrate and the buffer layer, a Bragg reflective layer is formed between the buffer layer and the n-type semiconductor to reflect light from the active layer. However, the Bragg reflective layer can only reflect light propagating in a direction vertical to the substrate. If light propagates in a direction deviated from the vertical direction, a reflective efficiency of the Bragg reflective layer is reduced.

What is needed, therefore, is a light emitting diode and a method for manufacturing the light emitting diode which can overcome the above-described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views, and all the views are schematic.

DETAILED DESCRIPTION

Embodiments of a light emitting diode and a method for manufacturing the light emitting diode will now be described in detail below and with reference to the drawings.

Figure 1:
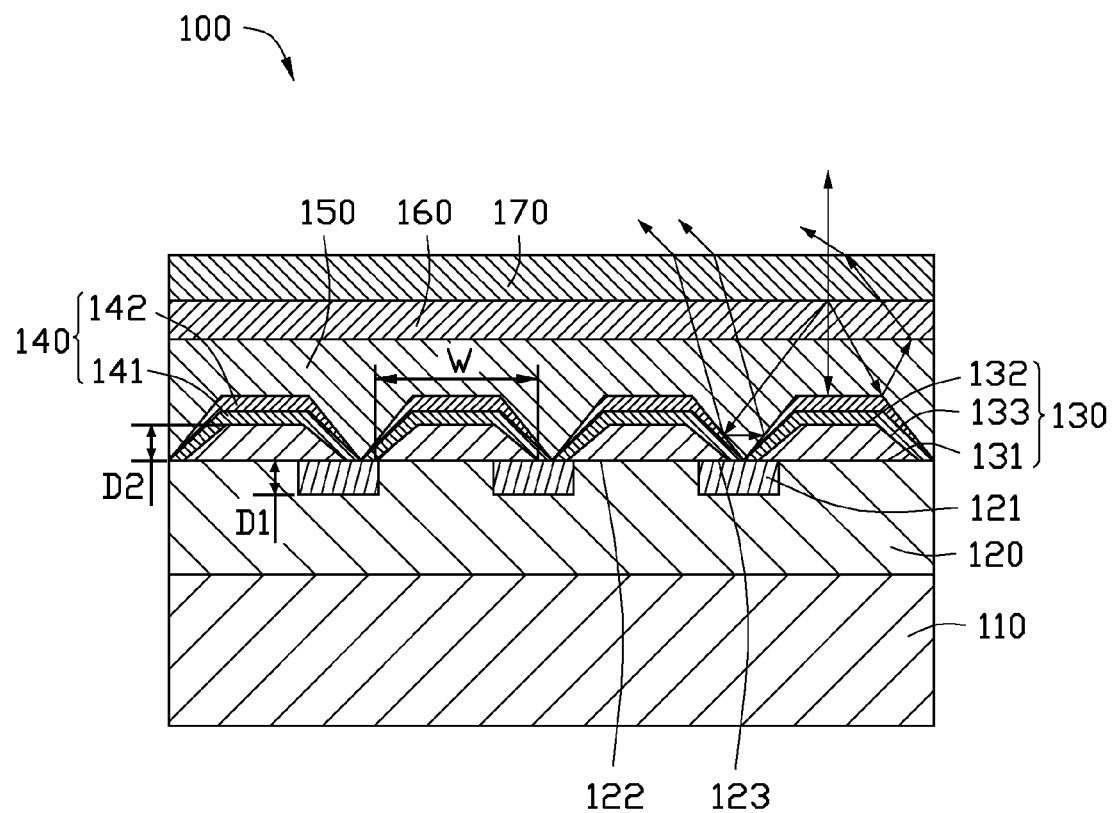
FIG. 1 is a cross-sectional view of a light emitting diode in accordance with an embodiment of the present disclosure, showing essential optical paths thereof.

Referring to FIG. 1, a light emitting diode 100 in accordance with an embodiment is provided. The light emitting diode 100 include a substrate 110, a first undoped gallium nitride (GaN) layer 120 formed on the substrate 110, a plurality of second undoped GaN layers 130 formed on the first undoped GaN layer 120, a Bragg reflective layer 140 formed on the second undoped GaN layers 130, and an n-type GaN layer 150, an active layer 160 and a p-type GaN layer 170 formed on the Bragg reflective layer 140.

The substrate 110 can be selected from a sapphire substrate, a silicon (Si) substrate and a silicon carbide (SiC) substrate.

A lower surface of the first undoped GaN layer 120 contacts the substrate 110. A plurality of ion implanted areas 121 are formed in an upper surface 122 of the first undoped GaN layer 120. Upper surfaces 123 of the ion implanted areas 121 are coplanar with the upper surface 122 of the first undoped GaN layer 120. The ion implanted areas 121 can be implanted with argon (Ar) ions or Si ions. A concentration of ions in the ion implanted areas 121 is in a range of from about $5*10^{15}$ $cm^{-3}$ (five times ten to the power of fifteen per cubic centimeter) to about $1*10^{17}$ $cm^{-3}$. Preferably, the concentration of the ion implanted areas 121 is about $1*10^{16}$ $cm^{-3}$. A depth (or thickness) D1 of the ion implanted areas 121 is in a range of from about 50 nm (nanometers) to about 150 nm. Preferably, the depth D1 of the ion implanted areas 121 is about 90 nm.

The second undoped GaN layers 130 are formed on the upper surface 122 of the first undoped GaN layer 120. Each of the second undoped GaN layers 130 is island shaped, and partly covers either one or two corresponding ion implanted areas 121. In this embodiment, each second undoped GaN layer 130 includes a bottom surface 131, an upper surface 132, and a circumferential side surface 133 connected between the bottom surface 131 and the upper surface 132. The bottom surface 131 is adjacent to the upper surface 122 of the first undoped GaN layer 120. The side surface 133 is oblique to the bottom surface 131, thereby making a width of a cross-section of the second undoped GaN layer 130 gradually decrease along a direction away from the first undoped GaN layer 120. Thus the cross-section of the second undoped GaN layer 130 is trapezoidal. In this embodiment, the cross-section of the second undoped GaN layer 130 is an isosceles trapezoid. A height (or thickness) D2 of the second undoped GaN layer 130 is in a range of from about 50 nm to about 300 nm. A width (or diameter) W of the second undoped GaN layer 130 is no less than about 3 µm (micrometers). Preferably, the height D2 of the second undoped GaN layer 130 is about 100 nm.

The Bragg reflective layer 140 covers the second undoped GaN layers 130 and portions of the upper surfaces 123 of the ion implanted areas 121 not covered by the second undoped GaN layers 130. In this embodiment, the Bragg reflective layer 140 includes an aluminum nitride (AlN) layer 141, and a GaN layer 142 stacked on the AlN layer 141. In other embodiments, the Bragg reflective layer 140 can include a plurality of AlN layers 141 and GaN layers 142 alternately stacked one on the other. The Bragg reflective layer 140 has a wave-shaped cross-section.

In the light emitting diode 100 described above, each of the second undoped GaN layers 130 is island shaped. When the Bragg reflective layer 140 is formed on the second undoped GaN layers 130, the Bragg reflective layer 140 has a wave-shaped cross-section. Besides reflecting light that propagates in a direction vertical to the substrate 110, the Bragg reflective layer 140 can also reflect light that propagates in a direction deviated from the vertical direction. Therefore, a light emitting efficiency of the light emitting diode 100 is improved.

Figure 2:
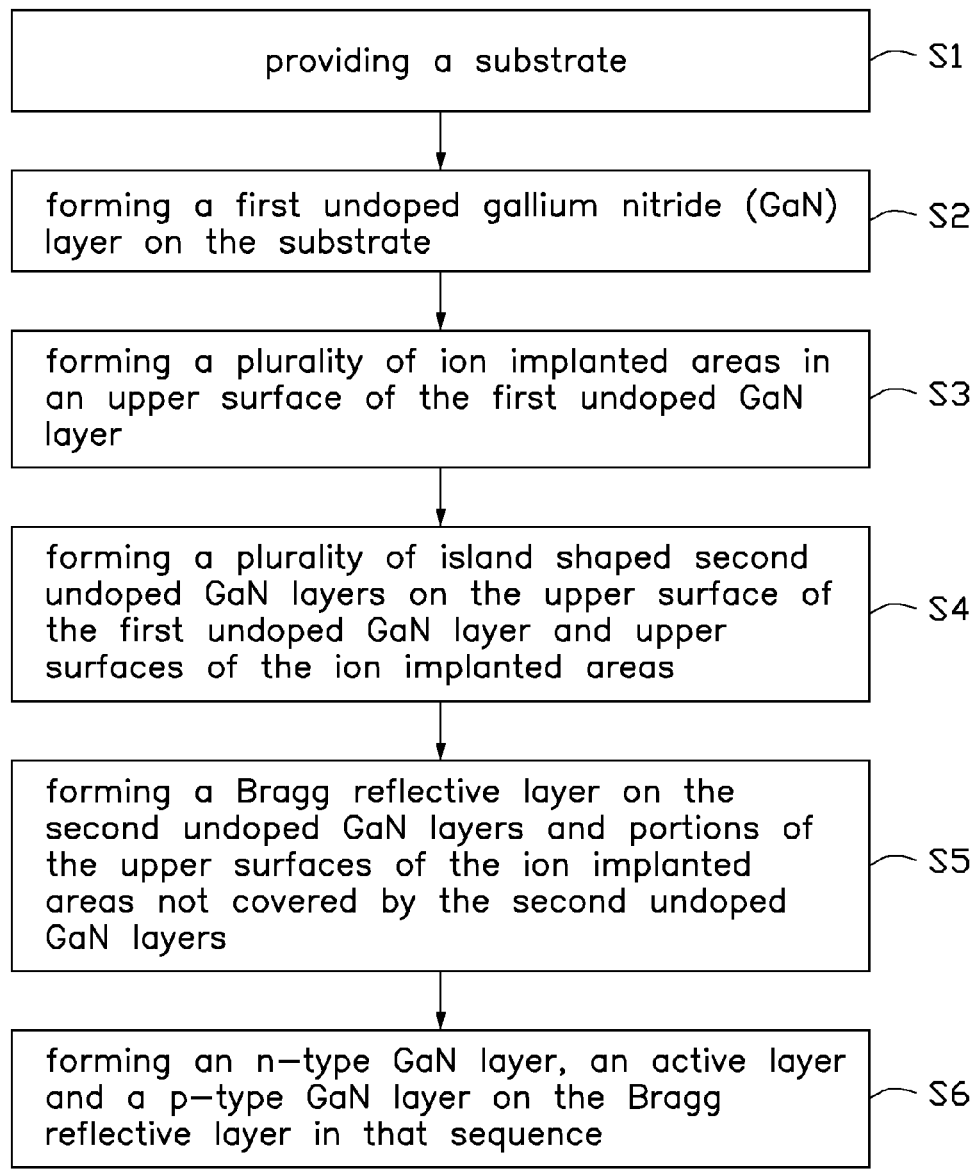
FIG. 2 is a flowchart showing steps of an exemplary method for manufacturing the light emitting diode in FIG. 1.

Referring to FIG. 2, an exemplary method for manufacturing the light emitting diode 100 includes the following steps S1-S6.

Figure 3:
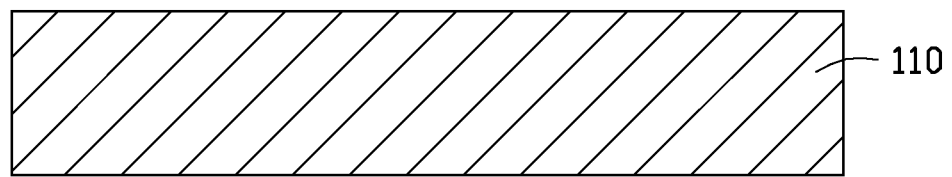
FIG. 3 is a cross-sectional view showing a first step of the method in FIG. 2.

Step S1: Referring to FIG. 3, a substrate 110 is provided. The substrate 110 can be a sapphire substrate, a Si substrate or a SiC substrate.

Figure 4:
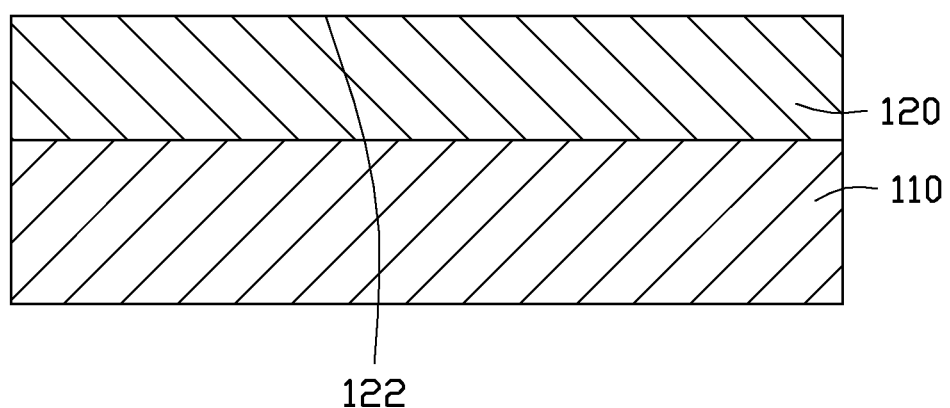
FIG. 4 is a cross-sectional view showing a second step of the method in FIG. 2.

Step S2: Referring to FIG. 4, a first undoped GaN layer 120 is formed on the substrate 110. The first undoped GaN layer 120 has an upper surface 122 away from the substrate 110.

Figure 5:
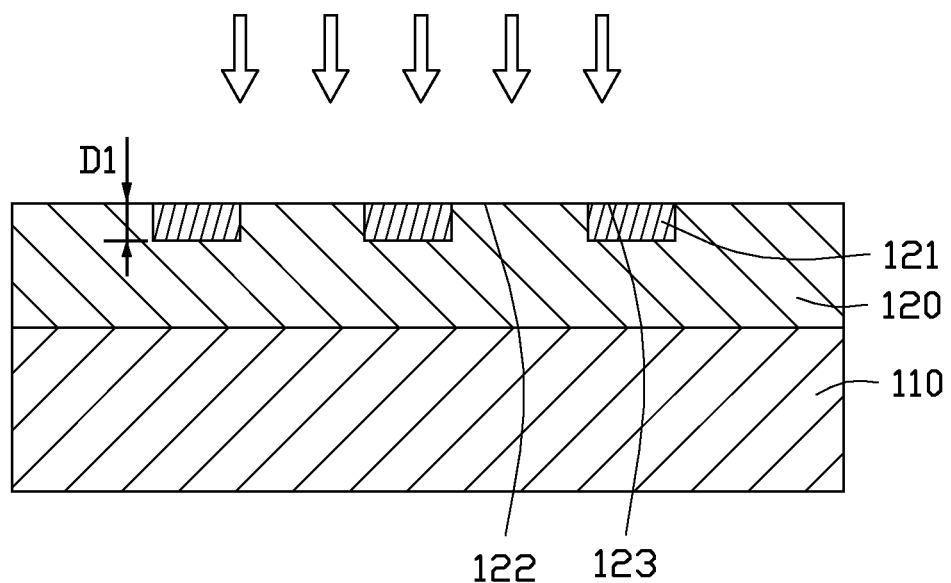
FIG. 5 is a cross-sectional view showing a third step of the method in FIG. 2.

Step S3: Referring to FIG. 5, a plurality of ion implanted areas 121 are formed on the upper surface 122 of the first undoped GaN layer 120. In the illustrated embodiment, the ion implanted areas 121 are formed by ion bombardment. The ion implanted areas 121 have upper surfaces 123 coplanar with the upper surface 122 of the first undoped GaN layer 120. The ion implanted areas 121 can be implanted with Ar ions or Si ions. A concentration of ions in the ion implanted areas 121 is in a range of from about $5*10^{15}$ cm$^{-3}$ to about $1*10^{17}$ cm$^{-3}$. Preferably, the concentration of the ion implanted areas 121 is about $1*10^{16}$ cm$^{-3}$. A depth D1 of the ion implanted areas 121 is in a range of from about 50 nm to about 150 nm. Preferably, the depth D1 of the ion implanted areas 121 is about 90 nm.

Figure 6:
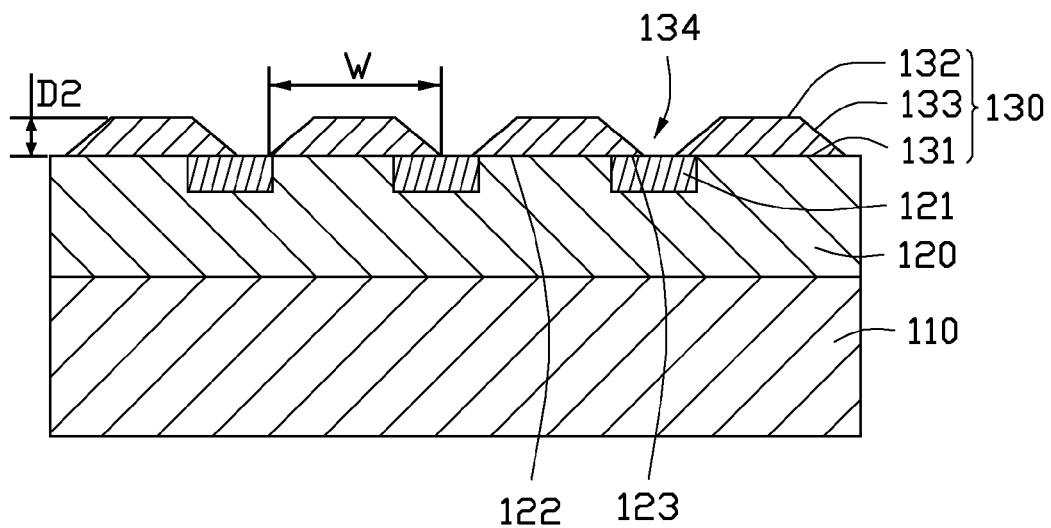
FIG. 6 is a cross-sectional view showing a fourth step of the method in FIG. 2.

Step S4: Referring to FIG. 6, a plurality of second undoped GaN layers 130 are formed on the upper surface 122 of the first undoped GaN layer 120 and the upper surfaces 123 of the ion implanted areas 121. Since a growth speed of a portion of each second undoped GaN layer 130 on the first undoped GaN layer 120 is different from a growth speed of a portion of each second undoped GaN layer 130 on the corresponding ion implanted area(s) 121, the second undoped GaN layer 130 becomes island shaped. A gap 134 is provided between each two adjacent second undoped GaN layers 130, to expose part of the upper surface 123 of the corresponding ion implanted area 121 thereat. In this embodiment, each second undoped GaN layer 130 includes a bottom surface 131, an upper surface 132, and a circumferential side surface 133 connecting between the bottom surface 131 and the upper surface 132. The bottom surface 131 is adjacent to the upper surface 122 of the first undoped GaN layer 120. The side surface 133 is oblique to the bottom surface 131, thereby making a width of a cross-section of the second undoped GaN layer 130 gradually decrease along a direction away from the first undoped GaN layer 120. In this embodiment, a height D2 of the second undoped GaN layer 130 is in a range of from about 50 nm to about 300 nm. A width W of the second undoped GaN layer 130 is no less than 3 μm. Preferably, the height D2 of the second undoped GaN layer 130 is about 100 nm.

Figure 7:
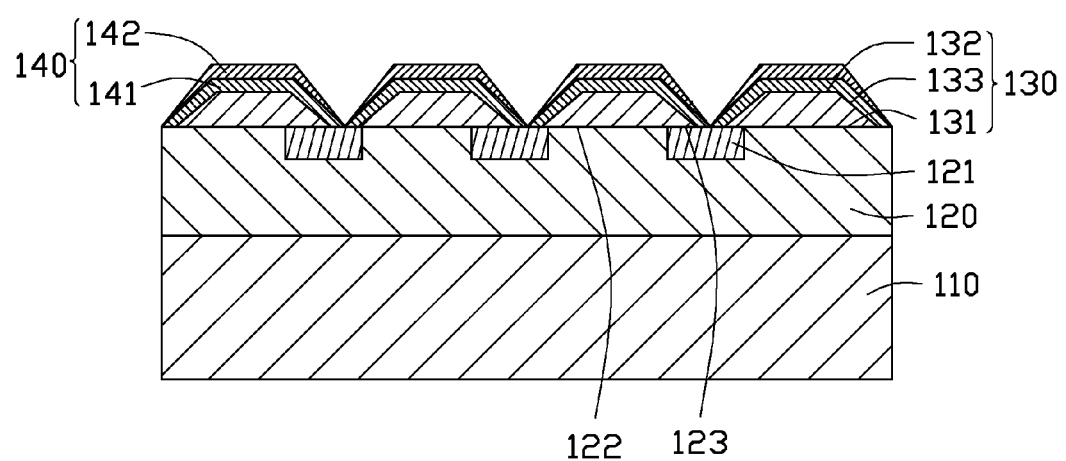
FIG. 7 is a cross-sectional view showing a fifth step of the method in FIG. 2.

Step S5: Referring to FIG. 7, a Bragg reflective layer 140 is formed on the upper surfaces 132 of the second undoped GaN layers 130 and portions of the upper surfaces 123 of the ion implanted area 121 not covered by the second undoped GaN layers 130. In this embodiment, the Bragg reflective layer 140 includes an AlN layer 141, and a GaN layer 142 stacked on the AlN layer 141. In other embodiments, the Bragg reflective layer 140 can include a plurality of AlN layers 141 and GaN layers 142 alternately stacked one on the other. The Bragg reflective layer 140 has a wave-shaped cross-section.

Figure 8:
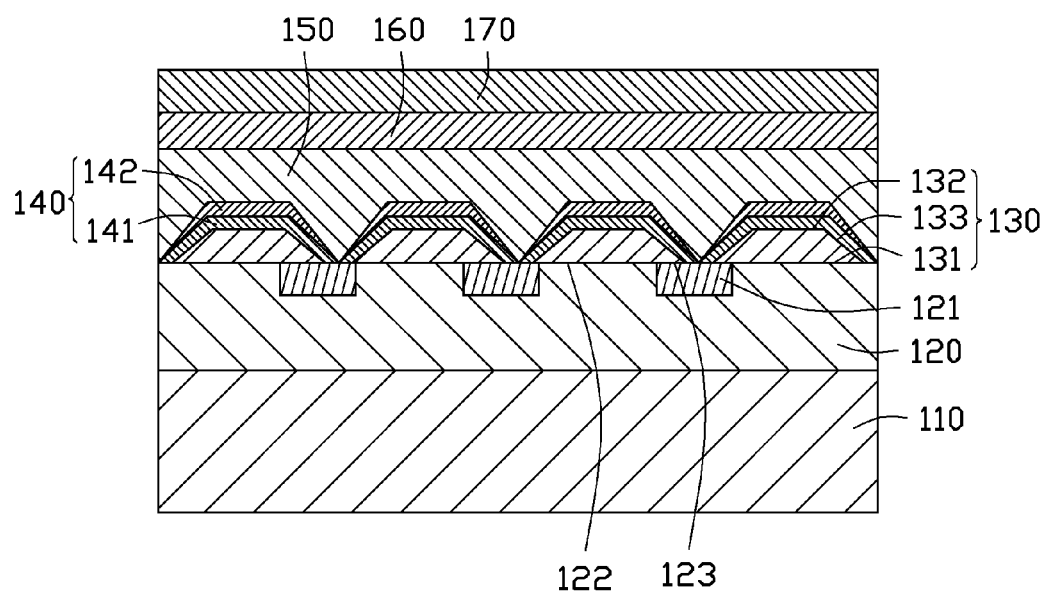
FIG. 8 is a cross-sectional view showing a sixth step of the method in FIG. 2.

Step S6: Referring to FIG. 8, an n-type GaN layer 150, an active layer 160 and a p-type GaN layer 170 are formed on the Bragg reflective layer 140 in that sequence.

It is to be further understood that even though numerous characteristics and advantages of the present embodiments have been set forth in the foregoing description, together with details of the structures and functions of the embodiments, the disclosure is illustrative only; and changes may be made in detail, especially in matters of shape, size, and arrangement of parts within the principles of the disclosure to the full extent indicated by the broad general meaning of the terms in which the appended claims are expressed.

What is claimed is:

1. A light emitting diode, comprising:
   a substrate;
   a first undoped gallium nitride (GaN) layer formed on the substrate, the first undoped GaN layer having a plurality of ion implanted areas in an upper surface thereof;
   a plurality of second undoped GaN layers formed on the first undoped GaN layer, each of the second undoped GaN layers being island shaped and partly covering at least one corresponding ion implanted area;
   a Bragg reflective layer formed on the second undoped GaN layers and on portions of upper surfaces of the ion implanted areas not covered by the second undoped GaN layers; and
   an n-type GaN layer, an active layer and a p-type GaN layer formed on an upper surface of the Bragg reflective layer in that sequence.

2. The light emitting diode of claim 1, wherein the ion implanted areas are implanted with one item selected from the group consisting of argon (Ar) ions and silicon (Si) ions.

3. The light emitting diode of claim 2, wherein a concentration of ions in the ion implanted areas is in a range of from about $5*10^{15}$ cm$^{-3}$ to about $1*10^{17}$ cm$^{-3}$.

4. The light emitting diode of claim 2, wherein a depth of each ion implanted area is in a range of from about 50 nanometers (nm) to about 150 nm.

5. The light emitting diode of claim 1, wherein a height of each second undoped GaN layer is in a range of from about 50 nanometers (nm) to about 300 nm.

6. The light emitting diode of claim 1, wherein a width of each second undoped GaN layer is no less than about 3 micrometers (μm).

7. The light emitting diode of claim 1, wherein the Bragg reflective layer comprises a plurality of aluminum nitride (AlN) layers and GaN layers alternately stacked one on the other.

8. A method for manufacturing a light emitting diode, comprising:
   providing a substrate;
   forming a first undoped gallium nitride (GaN) layer on the substrate;
   forming a plurality of ion implanted areas in an upper surface of the first undoped GaN layer;
   forming a plurality of second undoped GaN layers on the upper surface of the first undoped GaN layer and upper surfaces of the ion implanted areas, each of the second undoped GaN layers being island shaped, a gap being provided between each two adjacent second undoped GaN layers to expose part of the upper surface of a corresponding one of the ion implanted areas;
   forming a Bragg reflective layer on upper surfaces of the second undoped GaN layers and portions of the upper surfaces of the ion implanted areas not covered by the second undoped GaN layers; and
   forming an n-type GaN layer, an active layer and a p-type GaN layer on an upper surface of the Bragg reflective layer in that sequence.

9. The method of claim 8, wherein the ion implanted areas are implanted with one item selected from the group consisting of argon (Ar) ions and silicon (Si) ions.

10. The method of claim 9, wherein a concentration of ions in the ion implanted areas is in a range of from about $5*10^{15}$ cm$^{-3}$ to about $1*10^{17}$ cm$^{-3}$.

11. The method of claim 9, wherein a depth of each ion implanted area is in a range of from about 50 nanometers (nm) to about 150 nm.

12. The method of claim 8, wherein a height of each second undoped GaN layer is in a range of from about 50 nanometers (nm) to about 300 nm.

13. The method of claim 8, wherein a width of each second undoped GaN layer is no less than about 3 micrometers (μm).

14. The method of claim 8, wherein the Bragg reflective layer comprises a plurality of aluminum nitride (AlN) layers and GaN layers alternately stacked one on the other.

15. A light emitting diode, comprising:
a substrate;
a first undoped gallium nitride (GaN) layer formed on the substrate, the first undoped GaN layer having a plurality of ion implanted areas in an upper surface thereof;
a plurality of second undoped GaN layers formed on the first undoped GaN layer, each of the second undoped GaN layers having a trapezoidal cross-section and partly covering at least one corresponding ion implanted area;
a Bragg reflective layer, having a wave-shaped cross-section and formed on the second undoped GaN layers and on portions of upper surfaces of the ion implanted areas not covered by the second undoped GaN layers; and
an n-type GaN layer, an active layer and a p-type GaN layer formed on an upper surface of the Bragg reflective layer in that sequence.

16. The light emitting diode of claim 15, wherein the cross-section of each second undoped GaN layer is an isosceles trapezoid.

17. The light emitting diode of claim 15, wherein the ion implanted areas are planted with one item selected from the group consisting of Ar ions and Si ions.

18. The light emitting diode of claim 17, wherein a concentration of the ion implanted areas is in a range of from about $5*10^{15}$ cm$^{-3}$ to about $1*10^{17}$ cm$^{-3}$.

19. The light emitting diode of claim 15, wherein a width of the second undoped GaN layer is no less than about 3 micrometers (μm).

20. The light emitting diode of claim 15, wherein the Bragg reflective layer comprises a plurality of aluminum nitride (AlN) layers and GaN layers alternately stacked one on the other.

* * * * *